(12) United States Patent
Hsieh

(10) Patent No.: US 7,183,625 B2
(45) Date of Patent: Feb. 27, 2007

(54) EMBEDDED MIM CAPACITOR AND ZIGZAG INDUCTOR SCHEME

(75) Inventor: Yeou-Lang Hsieh, Shindian (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 147 days.

(21) Appl. No.: 10/926,836

(22) Filed: Aug. 26, 2004

(65) Prior Publication Data
US 2005/0077592 A1    Apr. 14, 2005

Related U.S. Application Data

(62) Division of application No. 10/314,664, filed on Dec. 9, 2002, now Pat. No. 6,800,534.

(51) Int. Cl.
*H01L 29/00* (2006.01)
*H01L 23/48* (2006.01)
*H01L 23/52* (2006.01)
*H01L 29/40* (2006.01)

(52) U.S. Cl. ............ 257/531; 257/532; 257/533; 257/758; 257/E23.044

(58) Field of Classification Search ......... 257/531, 257/532, 533, 758, E23.044
See application file for complete search history.

(56) References Cited

U.S. PATENT DOCUMENTS

| | | | |
|---|---|---|---|
| 5,162,258 A | 11/1992 | Lemnois et al. | |
| 5,708,559 A | 1/1998 | Brabazon et al. | |
| 5,895,948 A | 4/1999 | Mori et al. | |
| 6,180,976 B1 | 1/2001 | Roy | |
| 6,590,473 B1 | 7/2003 | Seo et al. | |
| 2003/0168716 A1 | 9/2003 | Lee et al. | |

FOREIGN PATENT DOCUMENTS

JP    2002-033239    *    3/2002

* cited by examiner

*Primary Examiner*—William M. Brewster
(74) *Attorney, Agent, or Firm*—Duane Morris LLP

(57) ABSTRACT

A new method to form RF devices in the manufacture of an integrated circuit device is achieved. The method comprises providing a substrate. A top metal level is defined overlying the substrate. The top metal level comprises pads and portions of planned RF devices. A first passivation layer is formed overlying the top metal level. The first passivation layer is patterned to selectively expose the pads and the parts of planned RF devices. A dielectric layer is formed overlying the top metal level and the first passivation layer. The dielectric layer is patterned to selectively expose the top metal level. An RF metal level is defined overlying the dielectric layer and the top metal level to thereby complete the RF devices. A second passivation layer is formed overlying the RF metal level, the dielectric layer, and the top metal level. The second passivation layer is patterned to expose the pads. The method is disclosed for damascene and non-damascene metal.

11 Claims, 13 Drawing Sheets

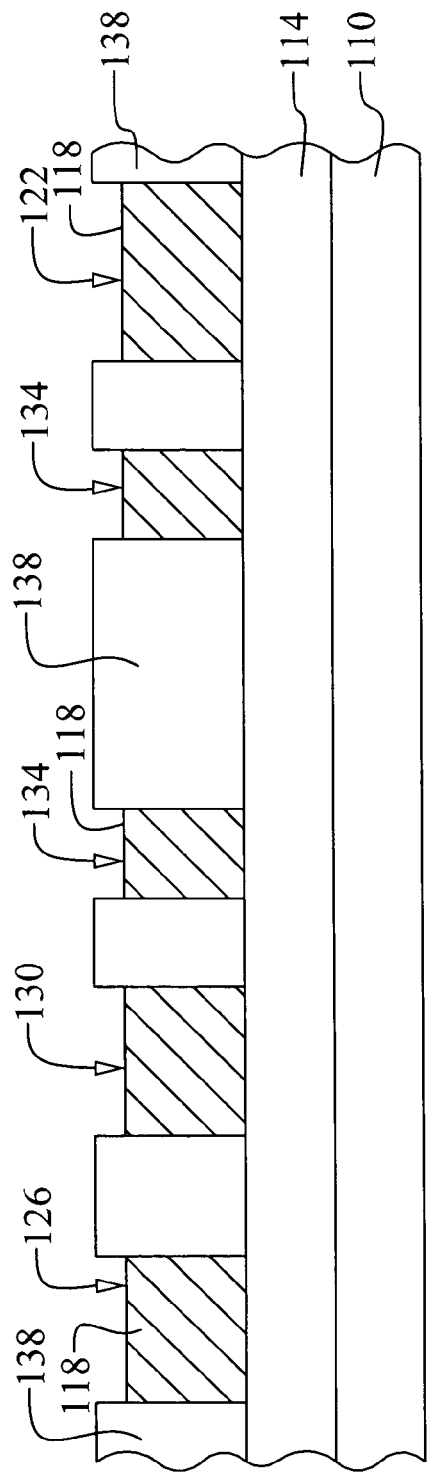
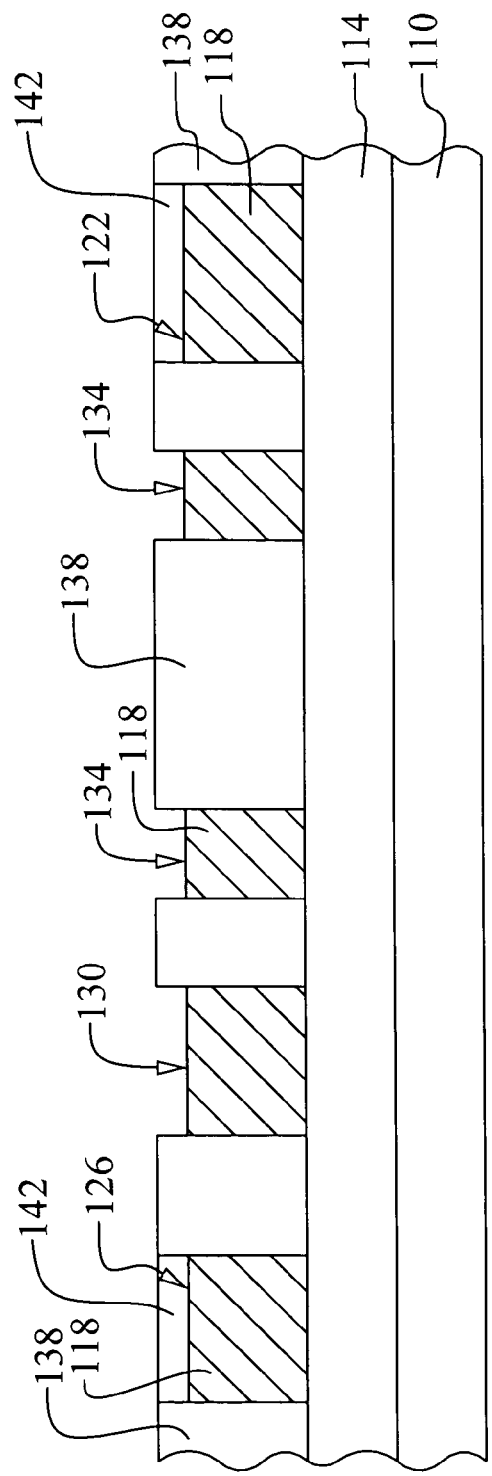
FIG. 7
FIG. 8

EMBEDDED MIM CAPACITOR AND ZIGZAG INDUCTOR SCHEME

RELATED APPLICATIONS

This application is a divisional of application Ser. No. 10/314,664, filed Dec. 9, 2002 now U.S. Pat. No. 6,800,534, which is incorporated herein in its entirety by reference and upon which priority is claimed.

BACKGROUND OF THE INVENTION (1) Field of the Invention

The invention relates to a method to form RF devices in an integrated circuit device, and, more particularly, to a method to form metal-insulator-metal (MIM) capacitors and inductors at a chip top level.

(2) Description of the Prior Art

Many types of electronic circuits require relatively large value capacitors and inductors. In particular, radio frequency (RF) circuits are those that function at large frequency levels even above the microwave range. Capacitors and inductors are passive components and are herein called RF devices. These RF devices frequently appear in RF circuits either in integrated form or as individual components.

For integrated circuit devices, the formation of large value capacitors and inductors presents a unique challenge for several reasons. First, these devices can consume large chip areas. Second, there can be interference between the capacitor/inductor and other parts of the circuit. These interactions can cause circuit malfunctions and tend to reduce the linearity of the RF devices. Third, it can be difficult to create devices with a large Q value. Fourth, obtaining precise values is difficult due to process variation.

Referring now to FIG. 1, an exemplary integrated circuit device is shown in cross section. A metal-insulator-metal (MIM) capacitor is formed by a fifth metal level (M5) 18, an insulator layer 22, and a top plate, metal layer 26. The MIM capacitor top plate 26 is coupled to the sixth metal level (M6) 38 through vias 34. A first insulator 14, that may comprise many insulating layers, is shown between the substrate 10 and the capacitor. A second insulator 30 is shown between M5 18 and M6 38. In this example, M6 38 is the top metal level for the process.

By forming the MIM capacitor in an upper metal level, a large capacitor can be constructed without consuming area on the substrate 10 where transistors, not shown, are formed. However, this approach suffers several problems. First, the top plate, metal layer 26 is relatively thin compared to M5 18 or M6 38. This is because the fifth via level 34 must couple M6 38 to M5 18 or to the top plate metal 26. By limiting the top plate metal 26 thickness, the parasitic resistance increases, and the Q value of the capacitor is reduced. Referring now to FIG. 4, the circuit model for the MIM capacitor is shown. The capacitor value is C 90, the top plate parasitic resistance is $R_{P1}$ 92, and the bottom plate parasitic resistance is $R_{P2}$ 93. Referring again to FIG. 1, note that the top plate 26 is coupled to M6 38 through vias 34. These vias 34 add significant contact resistance to the top plate parasitic resistance. Second, the capacitor value is limited by area constraints. The M5 18 and M6 38 levels are used for circuit connectivity. The capacitor must fit in the unused routing area. Third, there is a significant risk of interference with other circuit signals since the capacitor is formed in the interconnect routing levels M5 and M6.

Referring now to FIG. 2, a top view of an exemplary integrated circuit inductor is shown. An inductor 50 is shown. The inductor 50 is formed as a spiral line comprising M6 58 and M5 54. To facilitate interconnection the MS line 54 is coupled to M6 58 through the via 60. Referring now to FIG. 3, a cross sectional view of the inductor is shown. Several features should be noted. First, the inductor is formed in the upper metal layers M6 58 and M5 54. Next, note that the through metal M5 54 is coupled using vias 60. In addition, the inductor is formed over a part of the substrate 70 comprising a shallow trench isolation (STI) 74.

Several problems with this approach to forming the inductor should be noted. First, because the current flow through the inductor is parallel to the surface of the substrate 70, the magnetic flux 86 is primarily perpendicular to the surface of the substrate 70. This is why the inductor is fabricated over a part of the integrated circuit where no active devices are formed. Therefore, although the inductor is formed in an upper metal level, it still effectively consumes surface area in the substrate 70. Second, the inductor value is limited by the available surface area. Third, the vias 60 create a significant parasitic resistance that reduces the Q value of the inductor. Referring again to FIG. 4, the circuit model of inductor is shown. The inductor value is given by L 94. The parasitic resistance value is given by $R_P$ 97. Finally, a parasitic capacitor value is given by $C_P$ 96. Referring again to FIG. 2, this parasitic capacitance is caused by a MIM capacitor created by the interaction between the spiral metal lines 58 and the dielectric 62 therebetween. Fourth, the methods of forming the exemplary spiral inductor and capacitor are not compatible.

Several prior art inventions relate to the manufacture of metal-insulator-metal (MIM) capacitors in integrated circuit devices. U.S. Pat. No. 6,180,976 B1 to Roy discloses a method to form a MIM capacitor where the bottom plate is a damascene line. U.S. Pat. No. 5,895,948 to Mori et al shows a MIM capacitor process. U.S. Pat. No. 5,162,258 to Lemnios et al describes a method to customize a microwave integrated circuit device by incorporating a MIM capacitor. U.S. Pat. No. 5,708,559 to Brabazon et al discloses several methods to form MIM capacitors.

SUMMARY OF THE INVENTION

A principal object of the present invention is to provide an effective and very manufacturable method to form radio frequency (RF) devices in an integrated circuit device.

A further object of the present invention is to provide a method to form MIM capacitors having improved parametric performance.

A further object of the present invention is to provide a method to form inductors having improved parametric performance.

Another further object of the present invention is to provide a method to form RF devices producing less interference with other circuits in the integrated circuit device.

Another further object of the present invention is to provide both capacitors and inductors in a top metal layer.

In accordance with the objects of this invention, a method to form RF devices in the manufacture of an integrated circuit device is achieved. The method comprises providing a substrate. A top metal level is defined overlying the substrate. The top metal level comprises pads and portions of planned RF devices. A first passivation layer is formed overlying the top metal level. The first passivation layer is patterned to selectively expose the pads and the parts of planned RF devices. A dielectric layer is formed overlying the top metal level and the first passivation layer. The dielectric layer is patterned to selectively expose the top metal level. An RF metal level is defined overlying the dielectric layer and the top metal level to thereby complete the RF devices. A second passivation layer is formed overlying the RF metal level, the dielectric layer, and the top metal level. The second passivation layer is patterned to expose the pads.

Also in accordance with the objects of this invention, An integrated circuit device comprising a patterned top metal level overlying a substrate. The top metal level comprises bonding pads, bottom plates for capacitors, and terminals for inductors. A dielectric layer overlies the top metal level. A patterned RF metal level overlies the top metal level. The RF metal level comprises top plates for said capacitors overlying the bottom plates with the dielectric layer therebetween. The RF metal level comprises inductive lines for the inductors.

BRIEF DESCRIPTION OF THE DRAWINGS

In the accompanying drawings forming a material part of this description, there is shown:

FIGS. 5 through 11 illustrate a first preferred embodiment of the present invention.

DESCRIPTION OF THE PREFERRED EMBODIMENTS

The preferred embodiments of the present invention disclose a method to form RF devices in the manufacture of an integrated circuit device. The method is useful for the formation of high quality capacitors and inductors in a common process. It should be clear to those experienced in the art that the present invention can be applied and extended without deviating from the scope of the present invention.

Referring now to FIGS. 5 through 11, a first preferred embodiment of the present invention is illustrated. Several important features of the present invention are shown and discussed below. A partially completed integrated circuit device is shown in cross section. The method comprises providing a substrate 110. Preferably, the substrate 110 comprises silicon but could comprise silicon-on-insulator or any other semiconductor material. For simplicity of illustration, the substrate 110 is shown monolithically. It is understood by those skilled in the art that the substrate would further comprise active devices, such as transistors, formed by known methods.

As an important feature of the present invention, a top metal level 118 is defined overlying the substrate 110. An insulating layer 114 is formed overlying the substrate to isolate the substrate 110 from the top metal level layer 118. A typical integrated circuit device may comprise a plurality of metal levels. For example, the top metal level 118 may be the sixth or seven metal level in the interconnection scheme. Therefore, the insulating layer 114 is in fact much thicker than shown and may comprise a plurality of metal levels that are formed above the substrate 110 but below the top metal level 118. The top metal level 118 is herein construed as the metal level wherein the pads for the integrated circuit device are formed. This metal level 118 is compatible with the pad formation process for the device. For example, wire bonding pads are formed in this level 118. Alternatively, the top metal level 118 may be the foundation layer for the formation of flip chip, solder bumps.

In the first preferred embodiment, the top metal level 118 is defined using a deposit/etch process. In this embodiment, the top metal level 118 is deposited overlying the insulating layer 114. The top metal level 118 may be deposited using, for example, physical vapor deposition (PVD) or sputtering. Further, the top metal level 118 may comprise aluminum, copper, or an alloy of aluminum and copper. Further, the top metal level 118 may comprise a series of layers. For example, a barrier layer such as titanium nitride may be formed over or under an aluminum/copper layer to create the entire top metal level 118.

Figure 6:
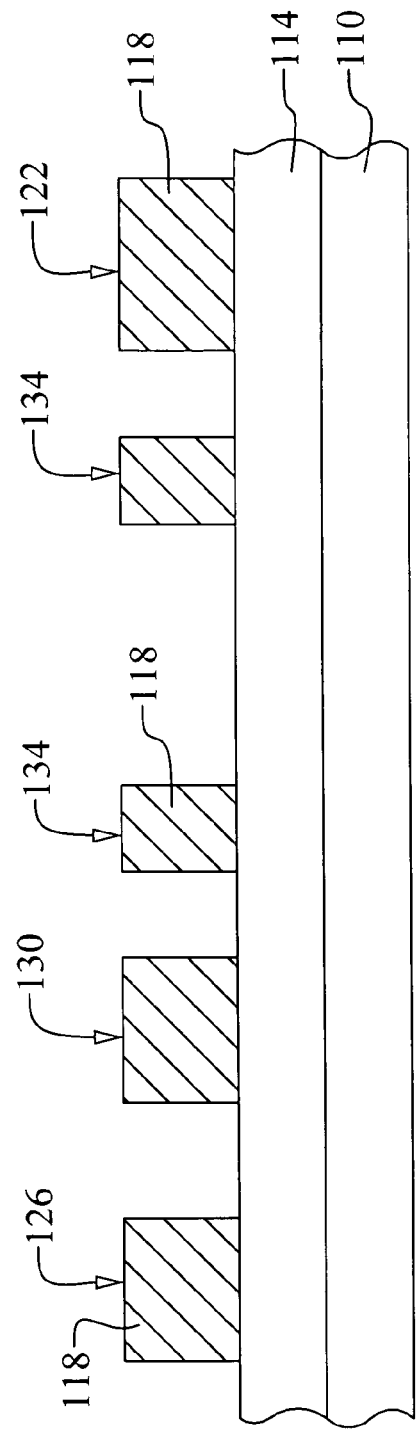

Referring now to FIG. 6, as an important step in a deposit/etch sequence, the deposited top metal level 118 is patterned. For example, a photoresist layer, not shown, may be coated overlying the metal level 118. The photoresist layer is then exposed to actinic light through a mask and developed. The remaining photoresist layer is then used to mask the metal level 118 during a metal etching process. Following the metal etch, the photoresist layer is removed to reveal the remaining top metal level 118 as shown. The top metal level 118 remaining comprises pads 122 and portions of planned RF devices 126, 130, and 134.

Referring now to FIG. 7, as an important feature in the first embodiment, a first passivation layer 138 is formed overlying the top metal level 118. The first passivation layer 138 may comprise any dielectric material. More preferably, the first passivation layer 138 comprises a silicon nitride layer that is deposited using, for example, low pressure, chemical vapor deposition (LPCVD). The first passivation layer 138 is then patterned to selectively expose the pads 122 and the parts 126, 130, and 134 of planned RF devices. The first passivation layer 138 may be patterned using a photoresist/etch process as described above.

Referring now to FIG. 8, as an important feature of the present a dielectric layer 142 is formed overlying the top metal level 118 and the first passivation layer 138. This dielectric layer 142 may comprise any dielectric material. More preferably, the dielectric layer 142 comprises silicon dioxide deposited using plasma enhanced chemical vapor deposition (PE-CVD). This dielectric layer 142 is formed to create a MIM capacitor dielectric thickness for the, particular operating conditions of the process. For example, the dielectric layer 142 is formed to a thickness of between about 100 Angstroms and 1,000 Angstroms.

As an important feature, the dielectric layer 142 is patterned to selectively expose the top metal level 118. More particularly, the dielectric layer 142 is patterned such that is covers planned bottom plates 126 of the capacitor and the planned pads 122 for the integrated circuit devices. At the same time, the dielectric layer 142 is removed from the planned top plate 130 of the capacitors and from the planned inductor 134. This dielectric layer 142 may be patterned, for example, using a photoresist/etching process as described above.

Figure 9:
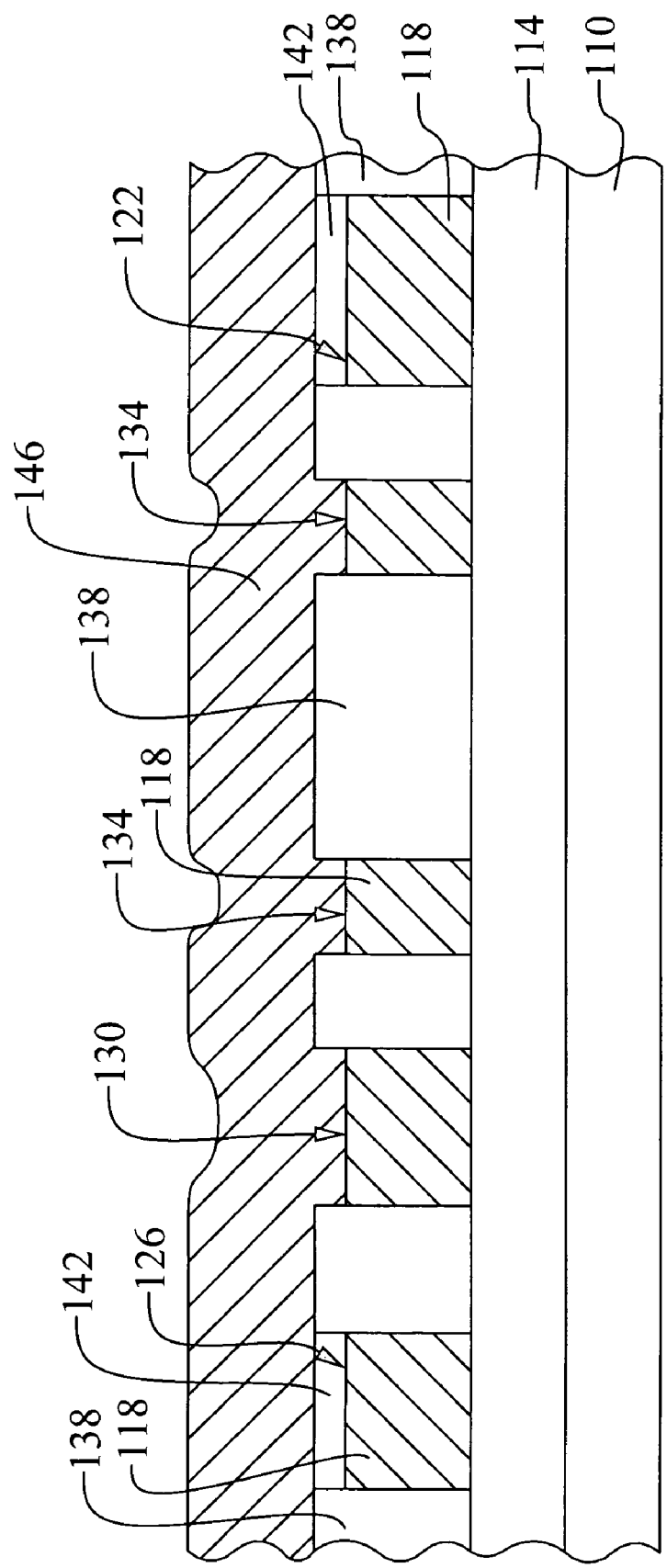

Referring now to FIG. 9, as another important feature of the first embodiment, an RF metal level 146 is deposited overlying the top metal level 118 and the dielectric layer 142. The RF metal level 146 comprises a metal layer that is specifically constructed to form top plates of capacitors and to form inductors having superior Q values. More preferably, the RF metal level 146 comprises aluminum, copper, or an alloy of aluminum and copper. Further, the RF metal level 146 may comprise a barrier layer, such as titanium nitride, deposited over or under the metal layer. The RF metal level 146 may be deposited, for example, using PVD or sputtering. As a particularly useful feature of the present invention, the RF metal level 146 may be made relatively thick. This is because the RF metal level 146 does not have to fit within the interconnect scheme between the top metal level and the underlying metal level as in the prior art. Rather, the RF metal level 146 can be made substantially thicker than in of the prior art. This leads to significant advantages in reducing parasitic resistance and in improving the Q value.

Figure 10:
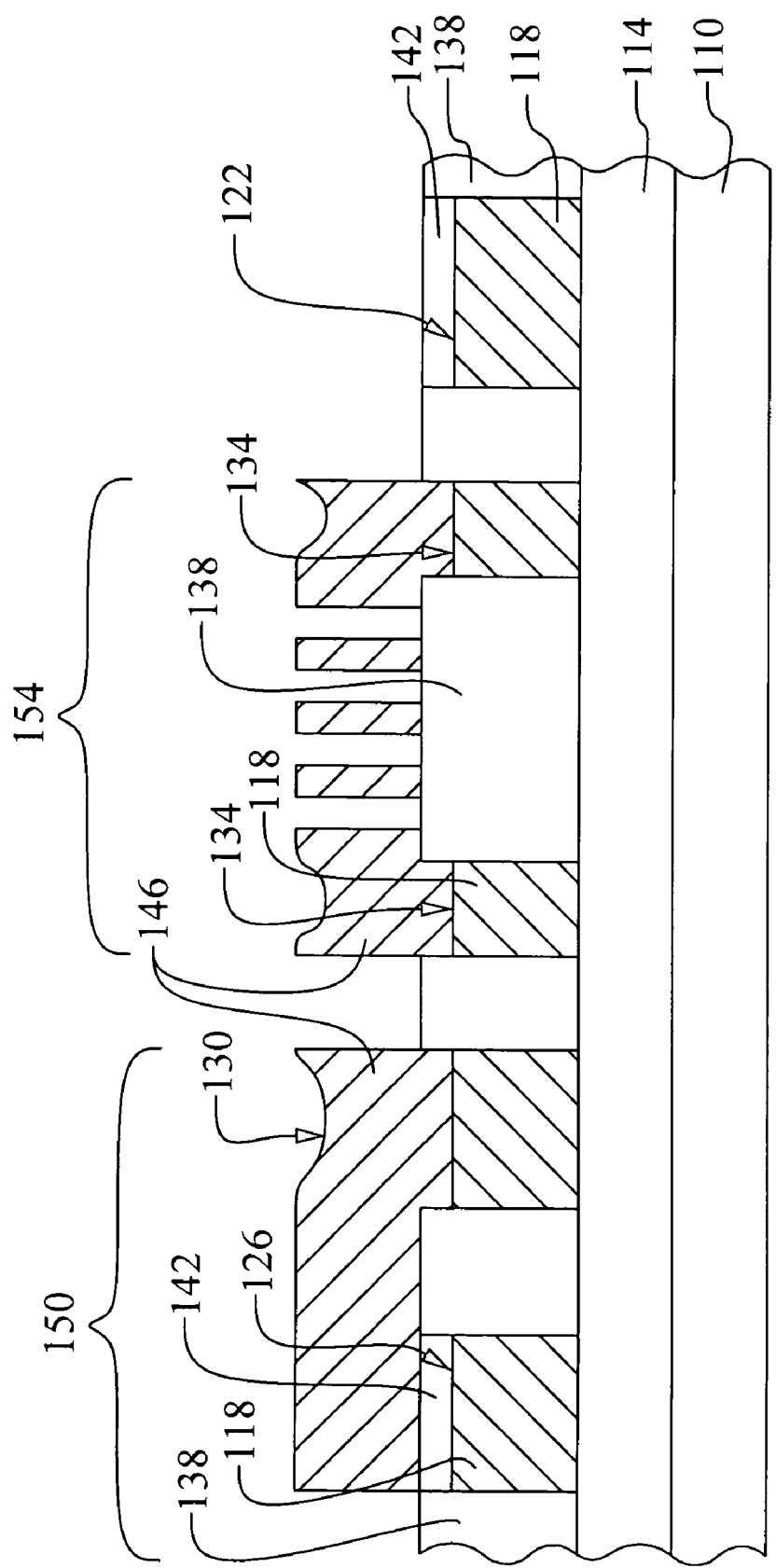

Referring now to FIG. 10, the RF metal level 146 is defined overlying the dielectric layer 142 and the top metal level 118 to thereby complete the RF devices 150 and 154. More specifically, the RF metal level 146 is patterned using, for example, a photoresist/etching process as described above. The resulting RF metal level 146 remains above the capacitors 150 to form the top plates of those capacitors 150. Further, the RF metal level 146 is patterned to form inductors 154, called zigzag inductors. The RF metal level 146 is removed from the pads 122.

Figure 17:
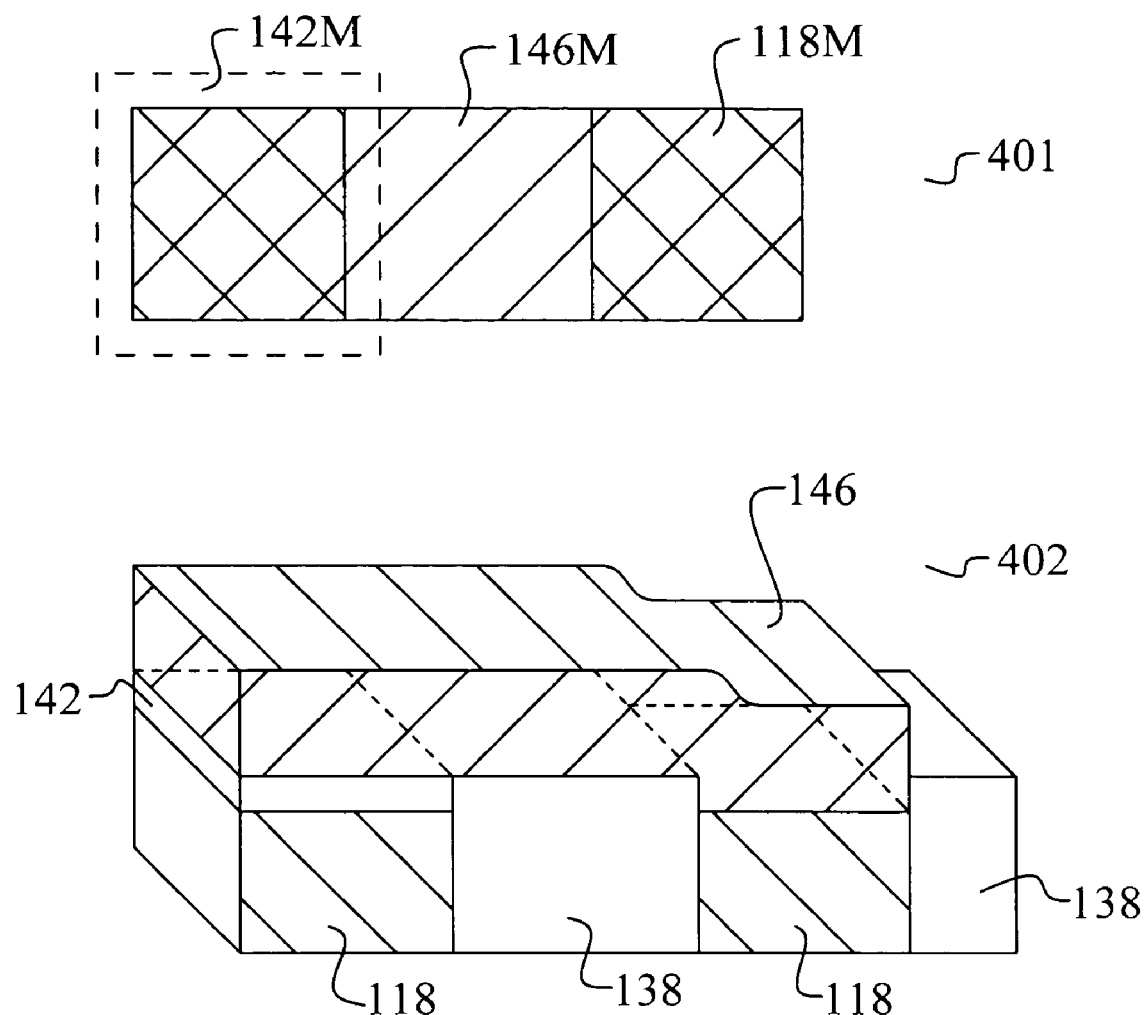
FIG. 17 illustrates a top layout view and an isometric view of the capacitor of the present invention.

Referring now to FIG. 17, a top layout view 401 and an isometric view 402 of the capacitor formed in the present invention are shown. The layout view 401 shows the dielectric layer mask 142M at the intersection of the RF metal layer mask 146M and the top metal layer mask 118M. The isometric view 402 shows the relationship of the RF metal layer 146, the dielectric layer 142, and the top metal layer 118.

Figure 18:
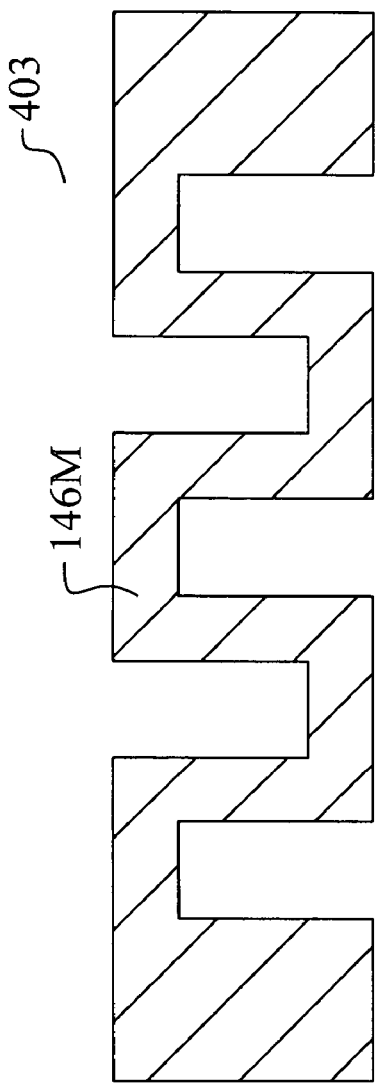
FIG. 18 illustrates a top layout view and an isometric view of the inductor of the present invention.
Figure 18:
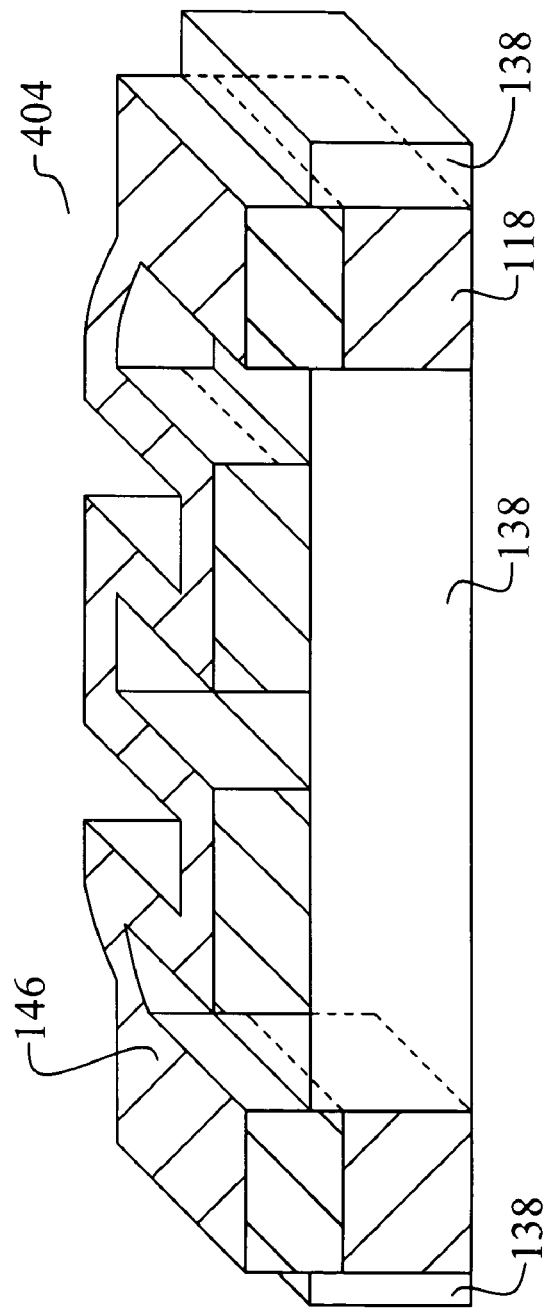

Referring now to FIG. 18, a top layout view 403 and an isometric view 404 of the inductor formed in the present invention are shown. The layout view 403 shows the RF metal layer mask 146M and illustrates an exemplary "zigzag" inductor layout. The isometric view 404 shows the relationship of the RF metal layer 146, the top metal layer 118, and the first passivation layer 138.

Figure 11:
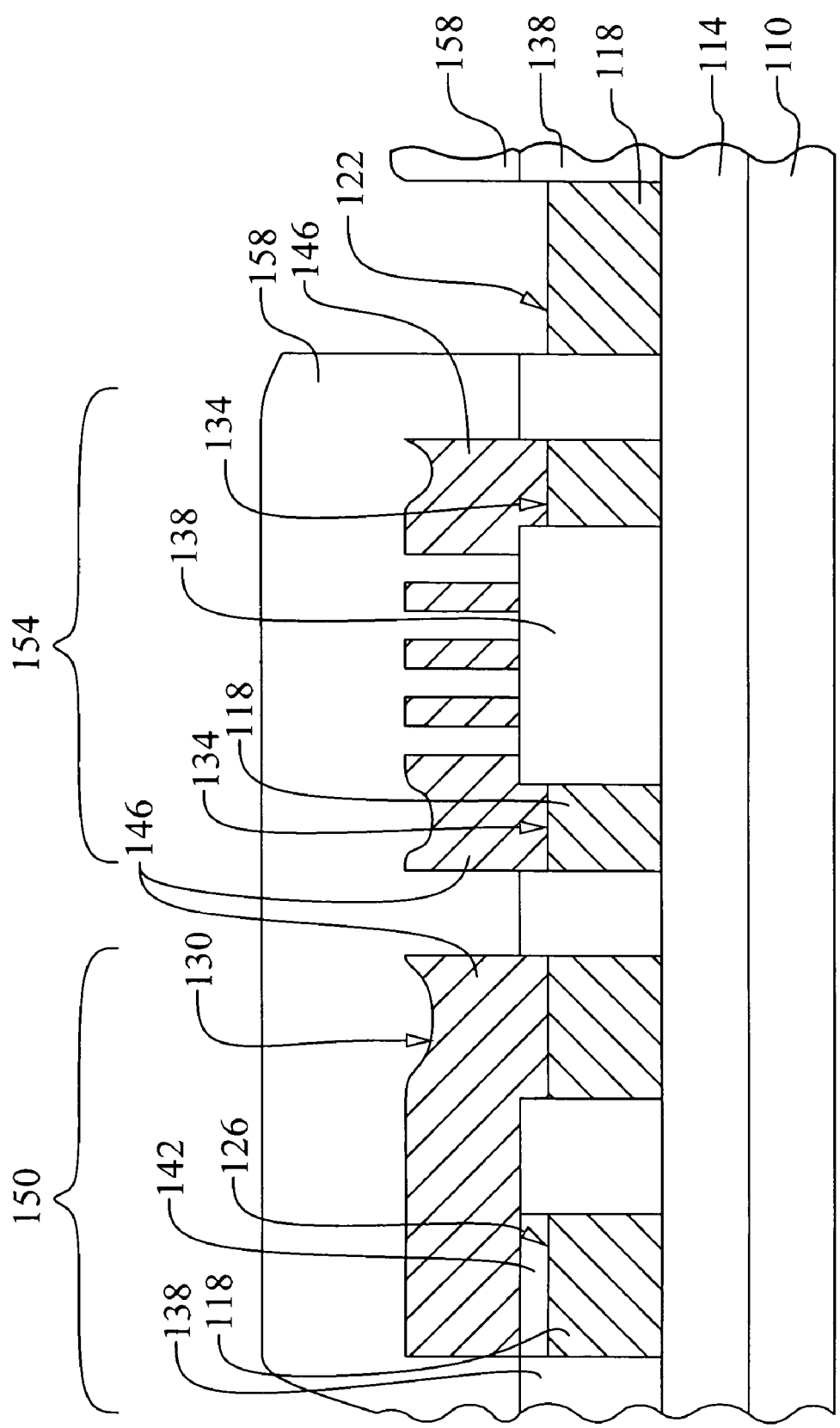

Referring now to FIG. 11, as another important feature of the present invention, a second passivation layer 158 is formed overlying the RF metal level 146, the dielectric layer 142, and the top metal level 118. The second passivation layer 158 may comprise any dielectric material. More preferably, the second passivation layer 158 comprises silicon nitride that may be depositing using LPCVD. The second passivation layer 158 is then patterned to expose the pads 122. The second passivation layer 158 may be patterned using, for example, a photoresist/etching process as described above. During the etching step, the dielectric layer 142 overlying the pads 122 is removed to reveal the top metal level 118.

Figure 1:
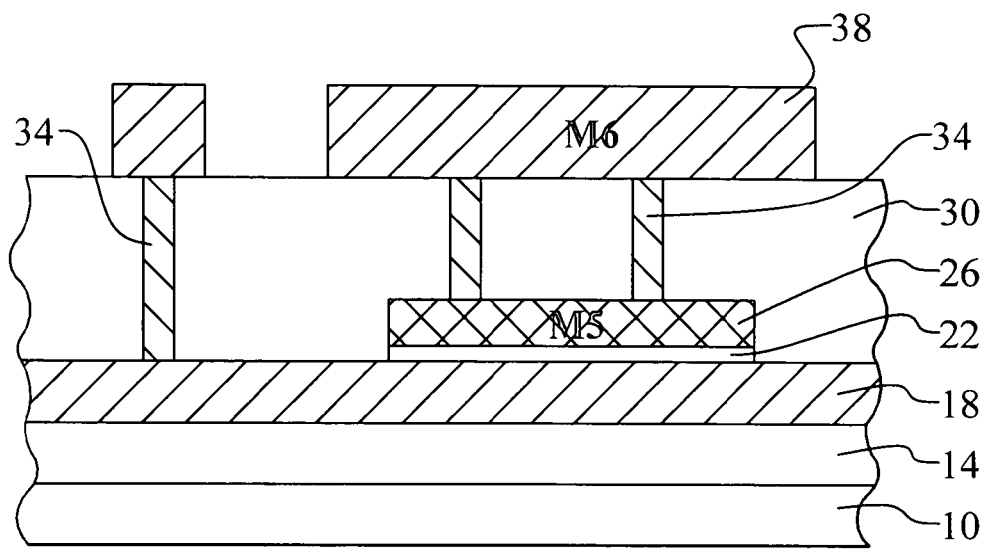
FIG. 1 illustrates an exemplary metal-insulator-metal (MIM) capacitor in cross section.
Figure 2:
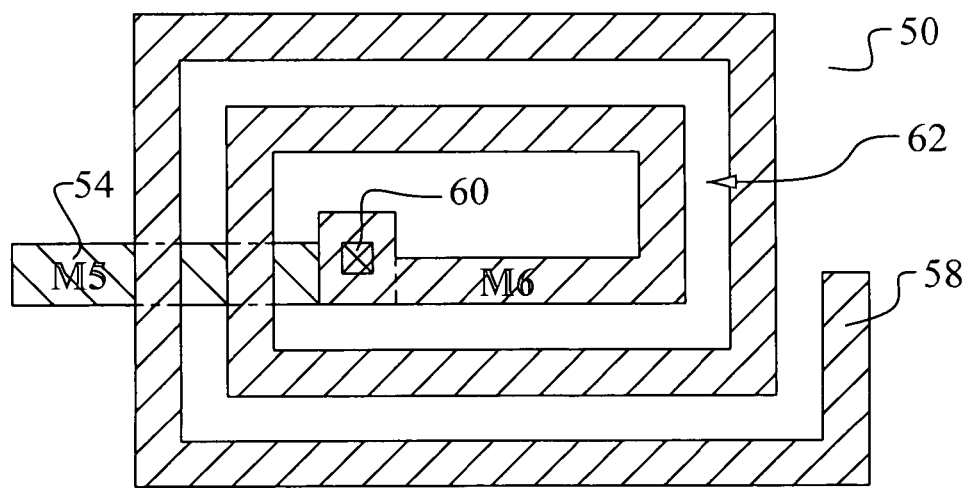
FIGS. 2 and 3 illustrate an exemplary spiral inductor in top view and in cross section.
Figure 3:
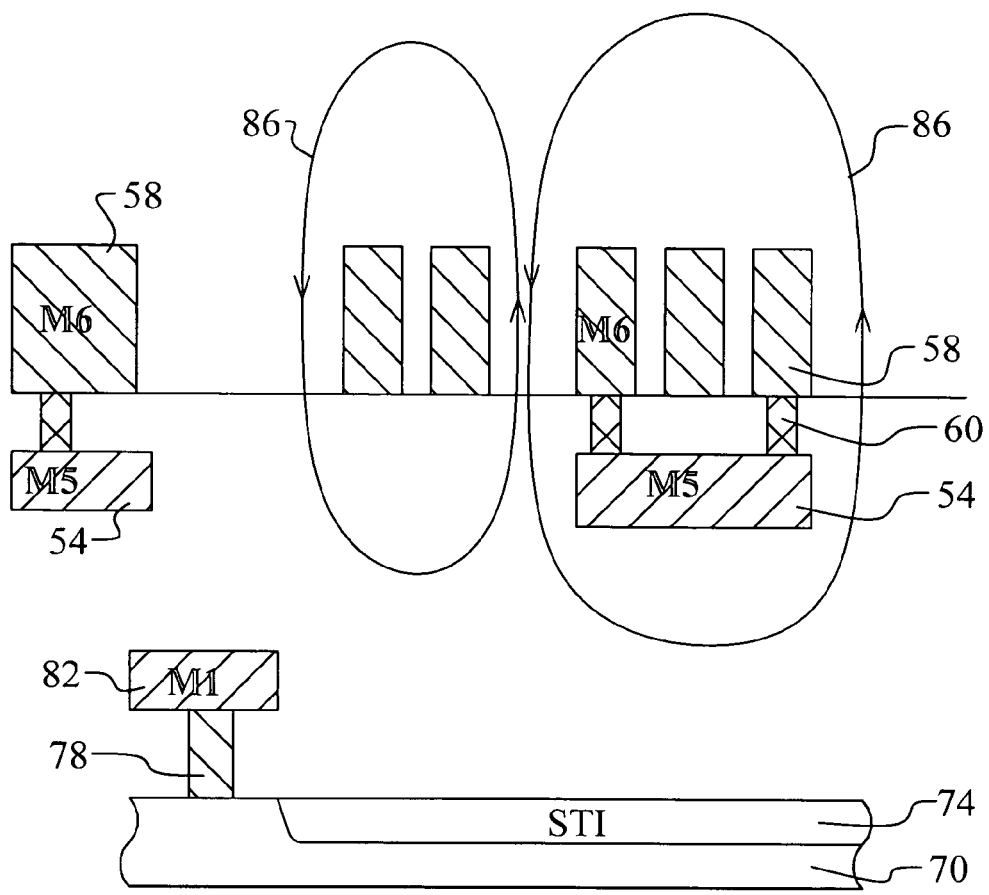
Figure 4:
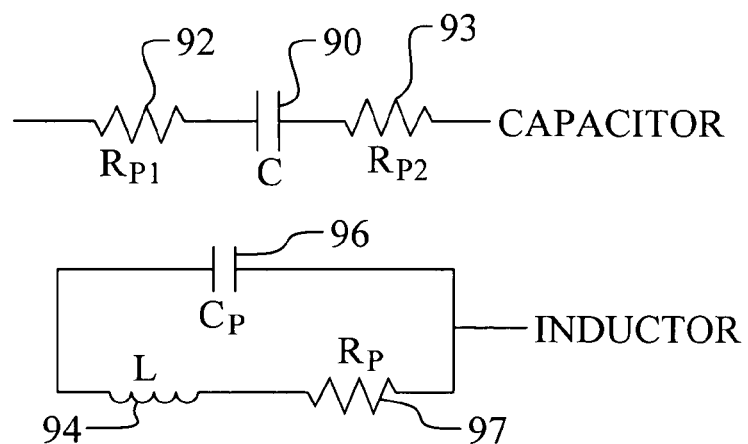
FIG. 4 illustrates circuit models for exemplary MIM capacitors and spiral inductors.
Figure 5:
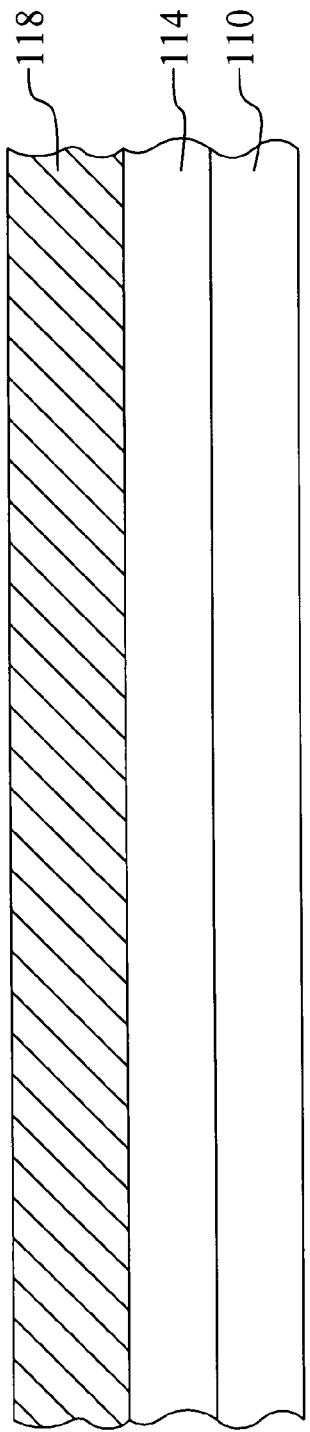

The resulting devices 150 and 154 provide several advantages over the prior art examples. First, since the RF metal level 146 is now the top most metal, the constraints which required a relatively thin top plate metal in FIG. 1 are no longer valid. Therefore, the RF metal level 146 can be made thicker to reduce the parasitic resistance in the capacitor 150. Second, vias are not needed for either the capacitor 150 or the inductor 154. Therefore, the parasitic resistance caused by vias is eliminated. Each of these effects results in an improved Q value for the RF devices 150 and 154. Third, the zigzag inductor 154 that is formed in the RF metal level 146 generates less magnetic flux near the surface of the substrate 110. Therefore, active devices, such as transistors, may be formed in the substrate 110 in the area immediately below the inductor 146. This means that a large value inductor may be formed without consideration for the effects on the underlying circuit layout in the substrate 110. Fourth, since the capacitor 150 is formed above the top level metal 118, interference with underlying circuits is minimized, and a large value capacitor may be formed with minimal effect on these circuits.

Figure 12:
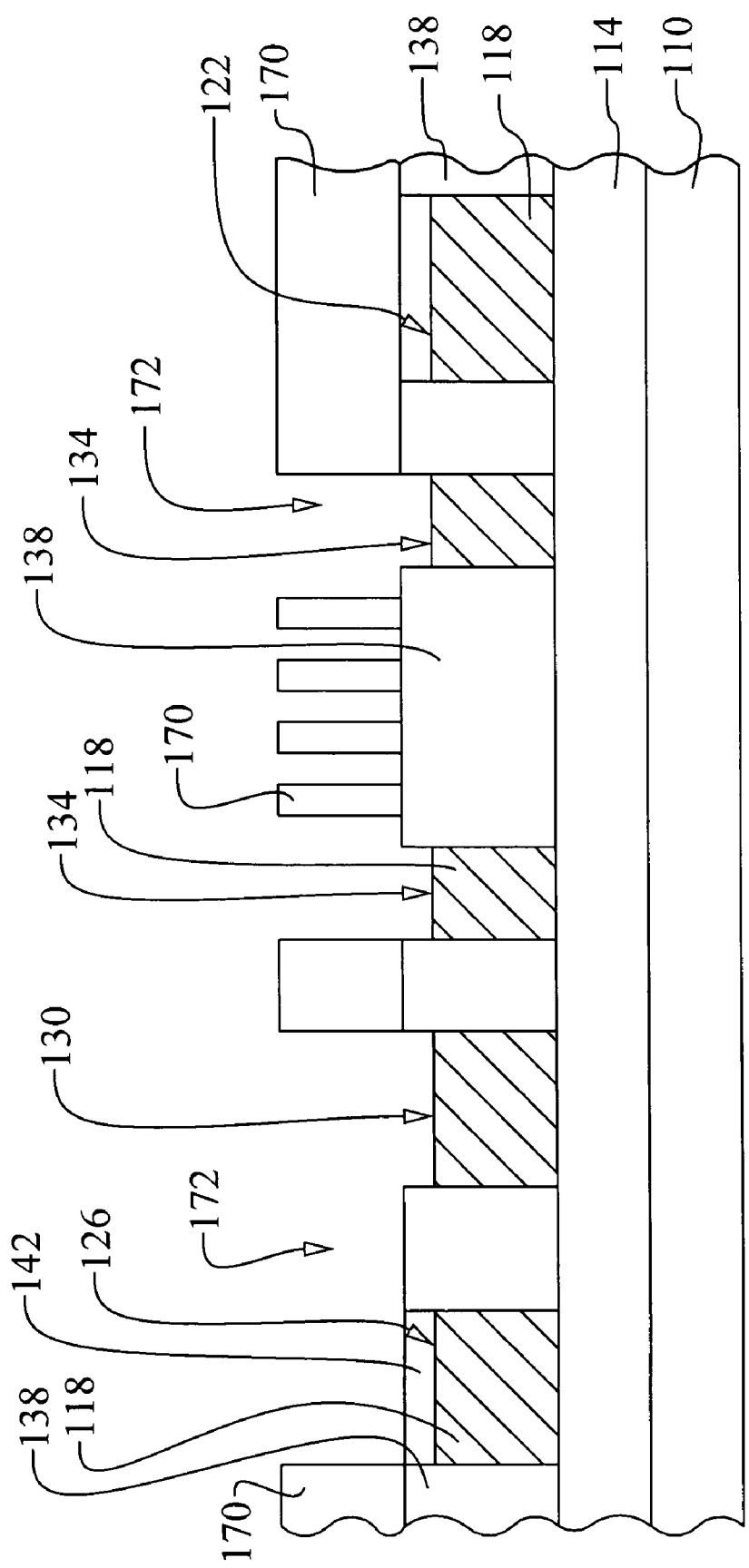
FIGS. 12 through 14 illustrate a second preferred embodiment of the present invention.
Figure 13:
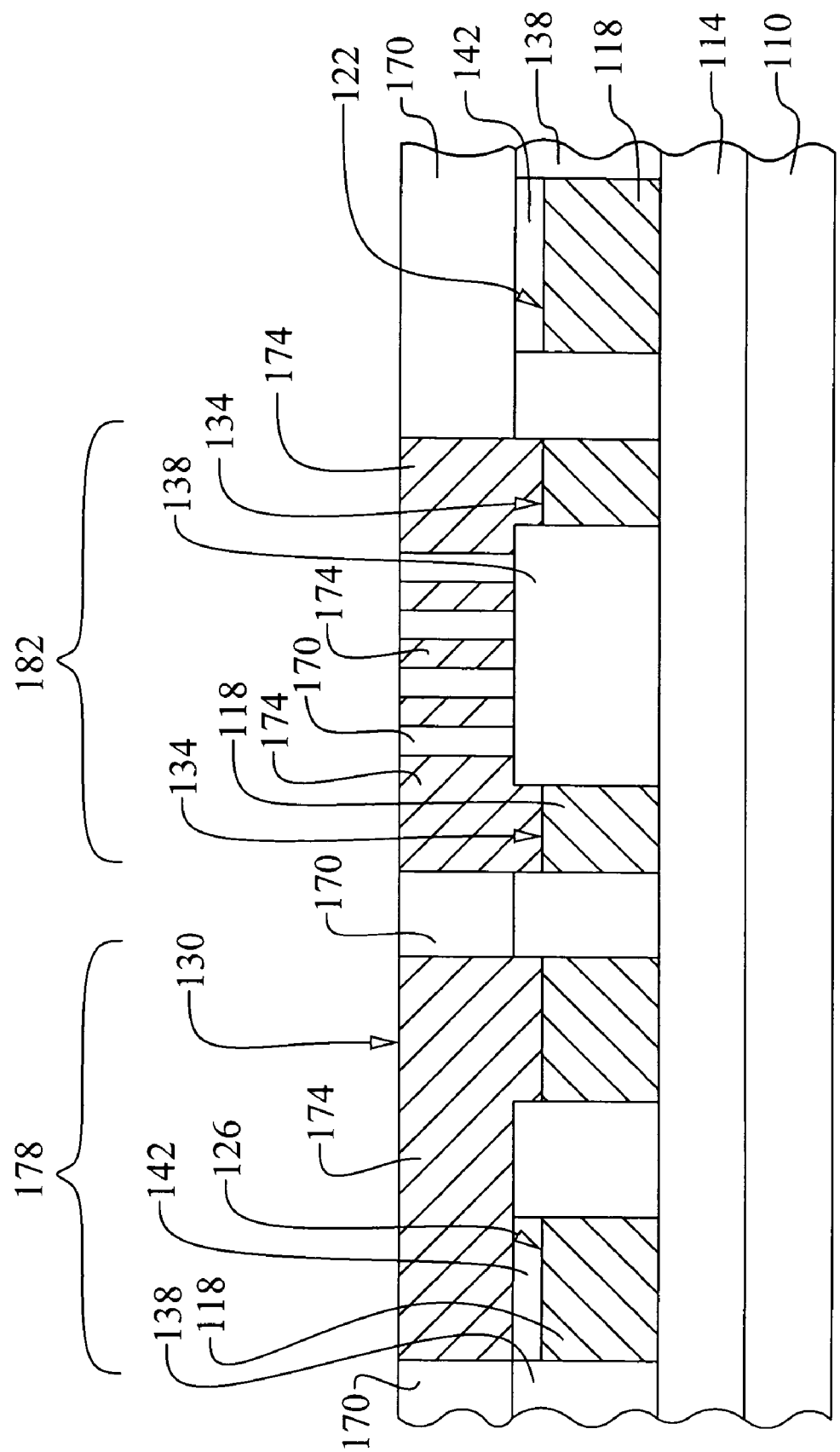
Figure 14:
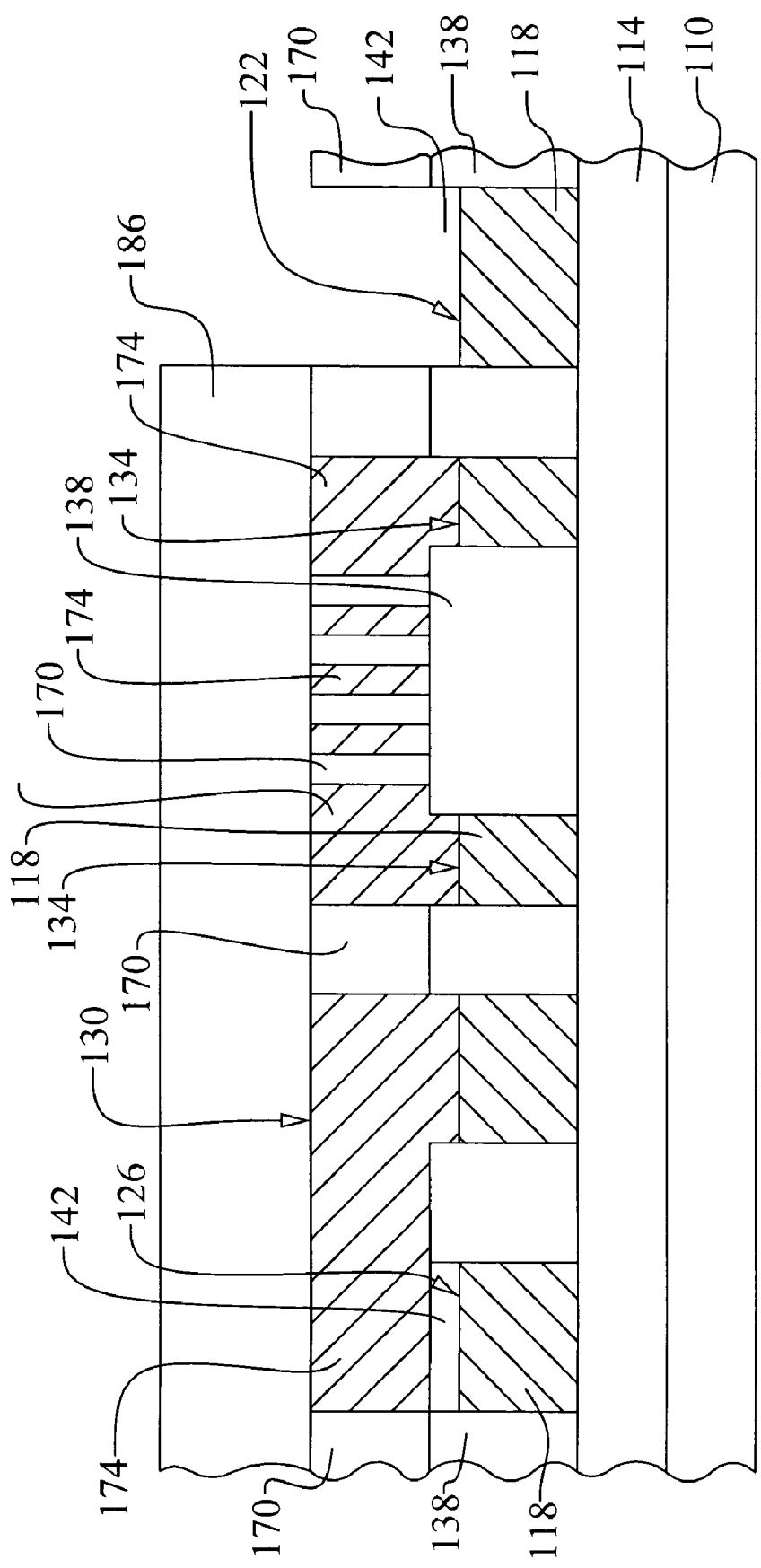

Referring now to FIGS. 12 through 14, a second preferred embodiment of the present invention is illustrated. In this case, a damascene process may be used to define the top metal level and the RF metal level. If copper is used for the metal levels, then it may be necessary to use a damascene process technique to define these metal level since it is very difficult to precisely etch copper.

In this second embodiment, the step of defining the top metal level 118 comprises, first, depositing the top level dielectric 138 overlying the substrate 110. The top level dielectric 138 may comprise a first passivation layer. The top level dielectric 138 is patterned to form trenches. The top metal level 118 is deposited overlying the top level dielectric 138 and filling the trenches. The top metal level 118 is then planarized. This planarization may comprise, for example, a chemical mechanical polish (CMP) step where the metal is polished down to below the top level dielectric layer 138. Other planarization approaches in the art may also be used.

In this second embodiment, the step of defining the RF metal level comprises first, depositing a RF level dielectric 170 overlying the first passivation layer 138, the dielectric layer 142, and the top metal level 118. The RF level dielectric 170 is patterned to form trenches 172. For example, the RF level dielectric 170 may be patterned using a photoresist/etching process as described above. Trenches 172 are defined for the capacitor top plates and the inductors. The RF level dielectric 170 remains overlying the pads 122.

Referring now to FIG. 13, the RF metal level 174 is deposited overlying the RF level dielectric 170 and filling the trenches. This RF metal level 174 may be deposited using, for example, PVD, sputter, or a plating operation. The RF metal level 174 is then planarized to complete the RF devices 178 and 182. The planarization step may comprise, for example, a CMP step. Other planarization approaches in the art may also be used. Referring now to FIG. 14, a second passivation layer 186 is formed overlying the RF metal level 174 and the first passivation layer 170. The second passivation layer 186 is patterned such that it is removed from the pads 122 while remaining overlying the RF devices.

Figure 15:
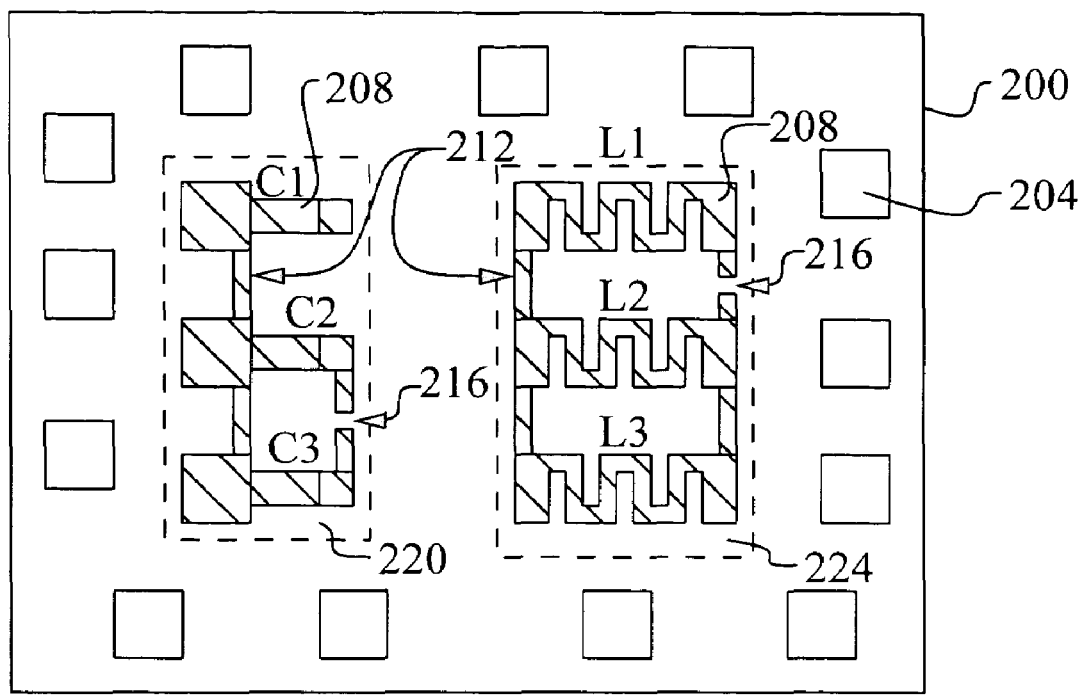
FIG. 15 illustrates a top view of an integrated circuit layout in the present invention.

Referring now to FIG. 15, a top view of an integrated circuit device 200 formed using the method of the present invention is shown. The illustration shows pads 204 formed using the top metal level. Capacitors C1–C3 are formed within the device 200 by the method described above. The RF metal layer 208 is shown. Different sizes of capacitors can be formed as shown by the different sizes of top plates. Inductors L1–L3 are also formed using the method of the present invention.

Several important features should be noted. First, excepting the pad areas, almost the entire area of the integrated circuit device 200 is available for forming the novel RF devices (C and L). Therefore, relatively large RF devices can be formed without increasing the area of the integrated circuit device 200. Second, capacitors and inductors may be formed in parallel or in series. For example, the capacitors C1–C3 are connected together using the RF metal layer 208 to form a capacitor network 220. Similarly, the inductors L1–L3 are connected using the RF metal layer 208 to form an inductor network 224. Further, combinations of capacitors and inductors may be connected using the RF metal layer 208 to form RF networks, or LC networks.

Third, these networks 220 and 224 can be configured to be precisely tuned. For example, the capacitors C1–C3 in the network 220 could be coupled together in series, in parallel, or in combinations of series and parallel using lines 212 in the RF metal layer 208. To tune the fabricated network 220, the network 220 performance would first be measured. Preferably, the capacitance of a capacitor network 220 would be measured directly, using a capacitance meter, or indirectly, by measuring a parameter of the circuit in which the network 220 is included. For example, a time constant could be measured to determine the relative value of the capacitor network 220. Next, if the measured value does not fall within specification, the network 220 could be altered by altering the RF metal layer 208.

The RF metal layer 208 could be altered by cutting lines 212 in the RF metal layer that are used to connect individual capacitors. This cutting would preferably be performed using a laser device. The RF metal layer 208 could be altered by depositing conductive material to make connections between individual capacitors that are not previously connected. To facilitate this approach, the RF metal layer 208 could be designed to have lines that are narrowly spaced 216. A machine that can deposit a conductive material to fill such a space 216 could be used to short such metal lines 208. By cutting, depositing, or both cutting and depositing, the capacitance network 220 can be adjusted. The precision of the adjustment possible would depend on how many capacitors are in the network and on the values of each capacitor. A network 220 with a large number of small capacitors would offer the best possible precision. A similar approach can be used to generate a precision inductor value using an inductor network 224 or a precision LC value using an LC network (not shown).

Figure 16:
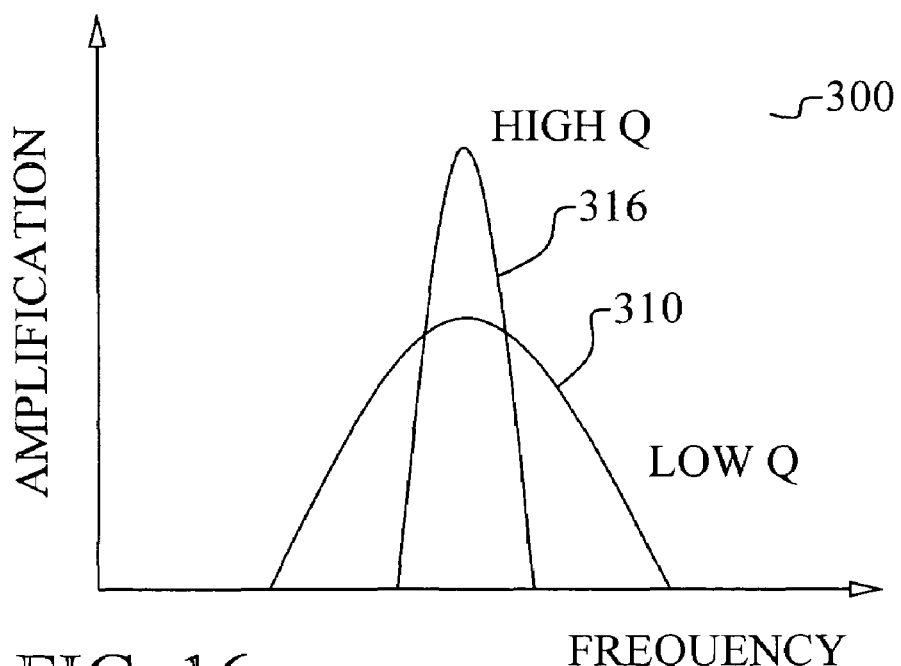
FIG. 16 illustrates the Q factor.

Referring now to FIG. 16, a plot of Q value performance 300 of the RF device is shown. When used in an amplifier, the Q value of the RF device (capacitor, inductor) directly effects the amplification over a frequency range. The amplification 310 is reduced in amplitude and is spread in range where the Q value is reduced. The amplification 316 is increased in amplitude and focused in range for the higher Q value device 316.

The advantages of the present invention may now be summarized. An effective and very manufacturable method to form radio frequency (RF) devices in an integrated circuit device is achieved. The method to form MIM capacitors improves parametric performance. The method to form inductors improves parametric performance. The method to form RF devices produces less interference with other circuits in the integrated circuit device. The method provides both capacitors and inductors in a top metal layer.

As shown in the preferred embodiments, the novel method of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:
   a patterned top metal level overlying a substrate wherein said top metal level comprises bonding pads, bottom plates for capacitors, and terminals for inductors;
   a dielectric layer overlying said top metal level; and
   a patterned RF metal level overlying said top metal level, wherein said RF metal level comprises top plates for said capacitors overlying said bottom plates with said dielectric layer therebetween and wherein said RF metal level comprises inductive lines for said inductors, wherein said dielectric layer includes openings therethrough that expose said bonding pads of said top metal level.

2. The device according to claim 1 wherein said capacitors are coupled together to form a capacitor network.

3. The device according to claim 1 wherein said inductors are coupled together to form an inductor network.

4. The device according to claim 1 wherein said capacitors and said inductors are coupled together to form an RF network.

5. The device according to claim 1 further comprising a passivation layer disposed between said top metal and said dielectric layer, said passivation layer and said dielectric layer including openings therethrough that expose said bonding pads.

6. The device according to claim 5 further comprising a further passivation layer disposed above said RF metal layer and including openings therethrough that expose said bonding pads.

7. An integrated circuit device comprising:
   a patterned top metal level overlying a substrate wherein said top metal level comprises bonding pads and bottom portions of planned RF devices;
   a dielectric layer overlying said top metal level; and
   a patterned RF metal level overlying said top metal level, wherein said patterned RF metal level comprises inductive lines for inductors and top portions for said planned RF devices that overlie said bottom portions of planned RF devices with said dielectric layer therebetween, wherein said dielectric layer includes openings therethrough that expose said bonding pads of said top metal level.

8. An integrated circuit device comprising:
   a patterned top metal level overlying a substrate wherein said top metal level comprises bonding pads and bottom portions of planned RF devices;
   a first passivation layer overlying said top metal level, said passivation layer including openings therethrough that expose said bonding pads and said bottom portions;
   a dielectric layer overlying said first passivation layer, said dielectric layer including openings therethrough that expose said top metal;
   a patterned RF metal level overlying said dielectric layer, wherein said RF metal level comprises top portions for said planned RF devices overlying said bottom portions of planned RF devices with said dielectric layer therebetween; and
   a further passivation layer disposed over said RF metal level, said further passivation layer including openings therethrough that expose said bonding pads.

9. The device according to claim 8, wherein said bottom portions of planned RF devices include bottom plates for capacitors and terminals for inductors and said top portions for said planned RF devices include top plates for said capacitors overlying said bottom plates with said dielectric layer therebetween.

10. The device according to claim 9, wherein said RF metal level includes inductive lines for said inductors.

11. The device according to claim 9, wherein said capacitors and said inductors are coupled together to form an RF network.

* * * * *